United States Patent [19]
Beech

[11] Patent Number: 4,700,216
[45] Date of Patent: Oct. 13, 1987

[54] DEMODULATOR FOR COLOR TELEVISION SIGNALS INCLUDING A SUB-CARRIER

[75] Inventor: Brian H. Beech, Hampshire, United Kingdom

[73] Assignee: Independent Broadcasting Authority, England

[21] Appl. No.: 782,740

[22] Filed: Sep. 24, 1985

[30] Foreign Application Priority Data

Feb. 6, 1984 [GB] United Kingdom ............... 8403068

[51] Int. Cl.[4] ............................................. H04N 9/66
[52] U.S. Cl. ...................................................... 358/23
[58] Field of Search ......................................... 358/23

[56] References Cited

U.S. PATENT DOCUMENTS 3,626,301 5/1970 Develet ............................. 325/420

OTHER PUBLICATIONS

Gardner, A Multifilter Phase-Lock Loop, Oct. 1971, IEEE Trans on Communication Technology, vol. COM-19, No. 5, pp. 669-675.

Primary Examiner—Michael A. Masinick

[57] ABSTRACT

A phase lock loop demodulator has its loop transfer function (F(s)) optimized to: $F(s)=A+B/s+CF_1(s)+DF_2(s)$ where $CF_1(s)$ is a chrominance sub-carrier term $DF_2(s)$ is a sound sub-carrier term and A, B, C and D are constants whereby to minimize the phase error signal appearing at the output of the phase comparator (10) of the loop. An equalizer circuit (14) may be added at the output of the loop in which case the transfer function ($F_T(s)$) of the equalizer circuit is as follows: $F_T(s)=K_oK_d+s/F(s)$ where $F(s)$ is the transfer function of the loop amplifier circuit (12) and A, $K_o$ and $K_d$ are constants.

9 Claims, 4 Drawing Figures

DEMODULATOR FOR COLOR TELEVISION SIGNALS INCLUDING A SUB-CARRIER

The present invention relates to a demodulator for television signals and more particularly to a modification of a phase lock loop demodulator to improve its performance e.g. its threshold performance.

Colour television signals are transmitted at present according to particular standard i.e. PAL, NTSC and SECAM. Each of these signals contain a chrominance sub-carrier and a sound sub-carrier would also normally be present.

The present invention provides a phase lock loop demodulator in which the loop transfer function (F(s)) is optimised to minimise the phase error signal appearing at the output of the phase comparator of the phase lock loop and due to the modulating signal.

The present invention provides a phase lock loop demodulator for colour television signals comprising a loop amplifier circuit having an input connected to a phase comparator circuit and an output, and a voltage controlled oscillator connected to form a feedback loop from the output of the loop amplifier circuit to the phase comparator circuit, characterised in that the transfer function (F(s)) for the loop amplifier circuit is as follows:

$$F(s) = A + B/s + CF_1(s/) + DF_2(s)$$

where
 $CF_1(s)$ is a chrominance subcarrier term
 $DF_2(s)$ is a sound subcarrier term and
 A,B,C and D are constants.

The present invention has the advantages when operating on a PAL or NTSC signal that the tendency for threshold spikes to appear in areas of high colour saturation is largely suppressed; the differential gain and phase of the demodulator will, in general, be reduced; and the degradation of threshold due to the presence of the sound sub-carrier is reduced.

A further improvement in performance can be achieved, if after the transfer function has been optimised the loop is modified to include means for introducing a delayed signal into the loop to reduce correlation errors whereby to correlate the signals between one portion and the next.

Preferably, the correlation is between frames but may be between lines.

Features and advantages of the present invention will become apparent from the following description of an embodiment thereof given by way of example with reference to the accompanying drawings, in which.

Figure 1:
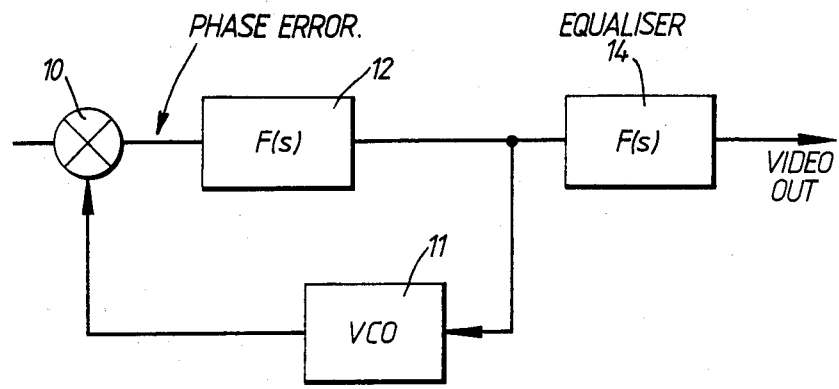
FIG. 1 shows a block diagram of a basic loop configuration according to the present invention.

Referring now to FIG. 1. a phase lock loop demodulator comprises a phase comparator 10 for comparing the phase of an input signal with the phase of the output of a voltage controlled oscillator 11. The output of the phase comparator 10 is fed to a loop amplifier and filter 12 which has a transfer function F(s) and to whose output is connected the input of the oscillator 11. The video output is taken from the junction between the output of the loop amplifier and filter 12 and the oscillator 11.

We have found that by optimising the transfer function F(s) the phase error signal appearing at the output of the phase comparator 10 can be minimised. The optimum situation results in a forward transfer function which is not flat over the video bandwidth. For this reason, an equaliser circuit 14 may be provided at the video output in order to achieve an overall flat video response.

The loop forward transfer function (LFT) can be expressed as follows:

$$LFT = \frac{A\frac{F(s)}{s}}{1 + KoKd\frac{F(s)}{s}}$$

and the transfer function $F_T(s)$ of the equaliser circuit 14 can be expressed as follows:

$$F_T(s) = KoKd + s/F(s)$$

where A, Ko, Kd are system constants.

For subcarrier immunity we have found that the general transfer function F(s) for the loop amplifier and filter 12 should be as follows:

$$F(s) = A + B/s + CF_1(s) + DF_2(s) + \cdots$$

where
 $CF_1(s)$ is a chrominance subcarrier term; and
 $DF_2(s)$ is a sound subcarrier term.
where A. B. C and D are system constants.

This represents the addition of band pass terms to a basic sound order function. Nyquists critereon for loop stability is met by this function.

Figure 2:
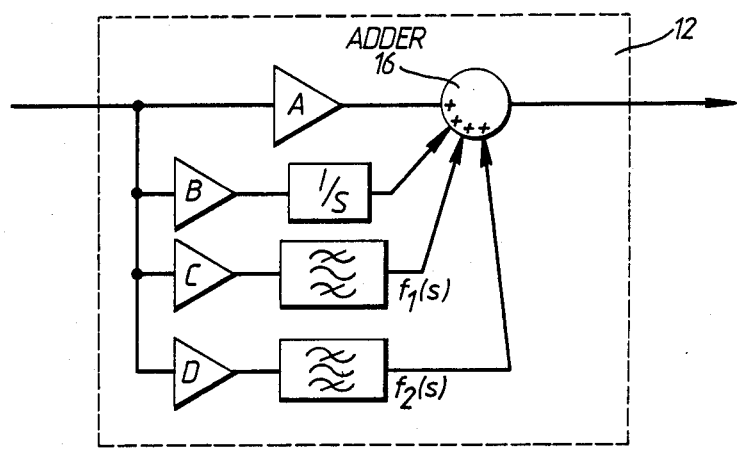
FIG. 2 shows a block diagram of how to implement a part of the loop shown in FIG. 1.
Figure 3:
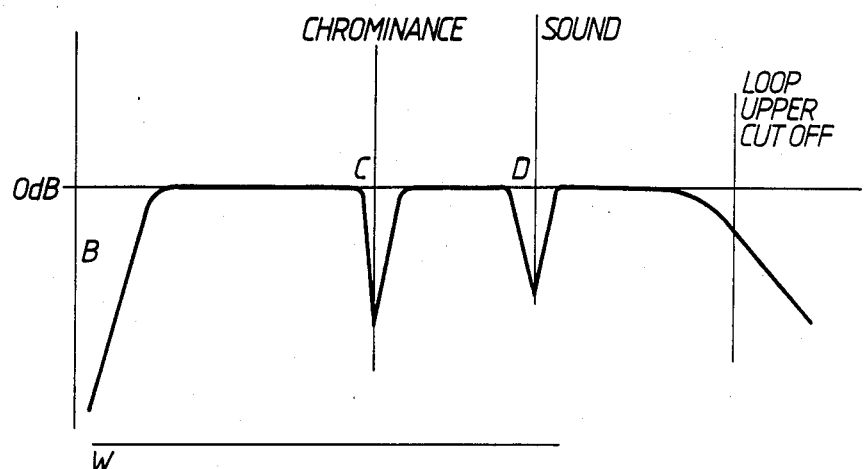
FIG. 3 shows a graph of loop error as a function of frequency.

A practical implementation of the loop amplifier and filter 12 is shown in FIG. 2 where each term of the generalised function given above is shown and all are added together in an adder 16. The error response of the arrangement shown in FIG. 2 is shown in FIG. 3. The inclusion of rejection in the loop error response at C and D represents an improvement to the threshold performance.

Figure 4:
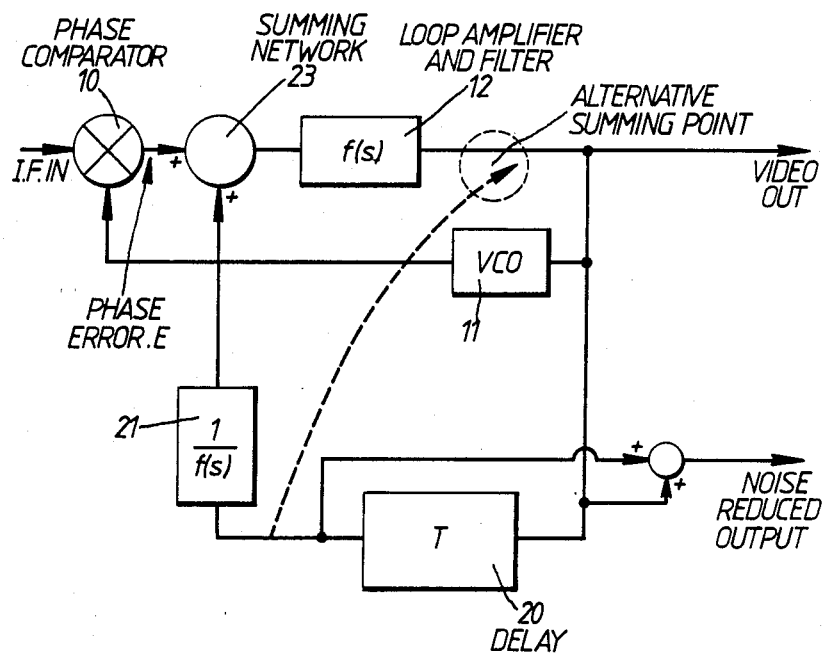
FIG. 4 shows a modification to the loop shown in FIG. 1.

Turning now to FIG. 4, this shows a modification to the circuit shown in FIG. 1, which can be implemented to provide a further improvement to the threshold performance of the demodulator. The same reference numerals are used for the same parts.

The technique is to firstly optimise the transfer function F(s) for the loop amplifier and filter circuit 12 as above and then add a delay circuit 20, and if necessary a further circuit 21 which has a transfer function which is itself a function of the transfer function F(s). Advantageously, the transfer function of the circuit 21 is the inverse of that of the circuit 12.

The delay introduced by the delay circuit 20 is preferably a frame delay but may be some other delay such as a line delay.

The further circuit 21 is required if the delayed signal from the delay circuit is added into the loop by a summing network 23 prior to the loop amplifier and filter circuit 12 but can be dispensed with if the summing network is after the loop amplifier and filter circuit 12.

The circuit shown in FIG. 4 does not introduce a time delay at the output of the demodulator as far as the signal itself is concerned.

A noise reduced output can be obtained by summing the signals at the input and output of the delay circuit 20. This might produce undesirable temporal effects. To counteract this, the weighting factors could be made dependent on the noise situation so that at high C/N ratios, any temporal effect is eliminated.

I claim:

1. A phase lock loop demodulator for colour television signals comprising a loop amplifier circuit (12) having an input connected to a phase comparator circuit (10) and an output, and a voltage controlled oscillator (11) connected to form a feedback loop from the output of the loop amplifier circuit (12) to the phase comparator circuit (10), characterised in that the transfer function (F(s)) for the loop amplifier circuit (12) is as follows:

$$F(s) = A + B/S + CF_1(s) + DF_2(s)$$

where
   $CF_1(s)$ is a chrominance subcarrier term
   $DF_2(s)$ is a sound subcarrier term and
   A, B, C and D are constants.

2. A demodulator according to claim 1, wherein the output of the loop amplifier circuit (12) is connected to an equaliser circuit (14) whose transfer function ($F_T(s)$) is as follows:

$$F_T(s) = KoKd + S/F(s)$$

where
   F(s) is the transfer function of the loop amplifier circuit (12); and
   A, Ko and Kd are constants.

3. A demodulator according to claim 2, further comprising a delay circuit having an input connected to the output from the loop amplifier circuit and an output connected to an adder network connected in series with the loop amplifier circuit.

4. A demodulator according to claim 3, wherein the adder network is connected between the output from the phase comparator and the input to the loop amplifier circuit, and a further circuit having a transfer function equal to 1/F(s) is connected in series with the output of the delay circuit between the delay circuit and the adder network.

5. A demodulator according to claim 3, wherein the delay circuit has a delay period equal to the period of one frame of the television signal.

6. A demodulator according to claim 1 and comprising a delay circuit (20) having an input connected to the output from the loop amplifier circuit (12) and an output connected to an adder network (23) connected in series with the loop amplifier circuit (12).

7. A demodulator according to claim 6, wherein the adder network (23) is located between the output from the phase comparator (10) and the input to the loop amplifier circuit (12), and wherein a further circuit (21) is connected in series with the output of the delay circuit (20) between the delay circuit (20) and the adder network (23), the further circuit (21) have a transfer function equal to 1/F(s).

8. A demodulator according to claim 7, wherein delay circuit (20) has a delay period equal to the period of one frame of the television signal.

9. A demodulator according to claim 7, wherein the delay circuit has a delay period equal to the period of one frame of the television signal.

* * * * *